(12) United States Patent
Buschbeck et al.

(10) Patent No.: US 6,702,901 B2
(45) Date of Patent: Mar. 9, 2004

(54) CHAMBER FOR CHEMICAL VAPOR DEPOSITION

(75) Inventors: Martin Buschbeck, Sevelen (CH); Johann Scholler, Eppertshausen (DE)

(73) Assignee: Unaxis Trading AG, Trubbach (CH)

( * ) Notice: Subject to any disclaimer, the term of this patent is extended or adjusted under 35 U.S.C. 154(b) by 262 days.

(21) Appl. No.: 09/999,611

(22) Filed: Oct. 24, 2001

(65) Prior Publication Data

US 2002/0108573 A1 Aug. 15, 2002

Related U.S. Application Data

(63) Continuation of application No. PCT/CH00/00194, filed on Apr. 4, 2000.

(30) Foreign Application Priority Data

Apr. 28, 1999 (DE) .......................... 199 19 326

(51) Int. Cl.[7] .............................................. C23C 16/00
(52) U.S. Cl. ...................................... 118/733; 118/715
(58) Field of Search .................................. 118/715, 733

(56) References Cited

U.S. PATENT DOCUMENTS

| 4,123,989 A | * | 11/1978 | Jewett ........................ 118/724 |
| 4,318,889 A | * | 3/1982 | Schiller ...................... 118/733 |
| 4,573,431 A | * | 3/1986 | Sarkozy ...................... 118/725 |
| 4,753,192 A | * | 6/1988 | Goldsmith et al. .......... 118/725 |
| 4,760,244 A | * | 7/1988 | Hokynar .................... 219/390 |
| 5,050,534 A | * | 9/1991 | Yates .......................... 118/733 |
| 5,224,999 A | * | 7/1993 | Shiraiwa et al. ............ 118/724 |
| 5,370,736 A | * | 12/1994 | Roy et al. ................... 118/719 |
| 2002/0108573 A1 | * | 8/2002 | Buschbeck et al. ......... 118/722 |
| 2003/0015142 A1 | * | 1/2003 | Hwang et al. .............. 118/733 |

FOREIGN PATENT DOCUMENTS

| EP | 0 915 191 A2 | * | 5/1999 |
| JP | 63-053919 A | * | 3/1988 |
| WO | WO 00/66805 | * | 11/2000 |

* cited by examiner

Primary Examiner—Jeffrie R. Lund
(74) Attorney, Agent, or Firm—Notaro & Michalos P.C.

(57) ABSTRACT

A chamber for chemical vapor deposition has an inner quartz tube encompassed by a shorter outer quartz tube in which each end of the inner quartz tube is encompassed by a first flange. The first flange has a groove encircling in the longitudinal direction of the inner quartz tube, in which in each instance a front of the inner quartz tube is positioned. Between the first flange and the outside of the inner quartz tube, a seal is disposed. On the first flange in the direction toward the tube center, a second flange is disposed which has an encircling rim for fixing the front side of the shorter outer quartz tube and which is in contact on the outside of the inner quartz tube as well as on the outside of the shorter outer quartz tube. Between the second flange and the outside of the shorter outer quartz tube, a seal is disposed. The second flange minimally includes a closable connection line which is connected to the volume between the shorter outer quartz tube and the inner quartz tube, and in which each first flange and each second flange on the inside comprises in each instance one cooling channel with minimally one inlet and one outlet for a cooling medium.

8 Claims, 3 Drawing Sheets

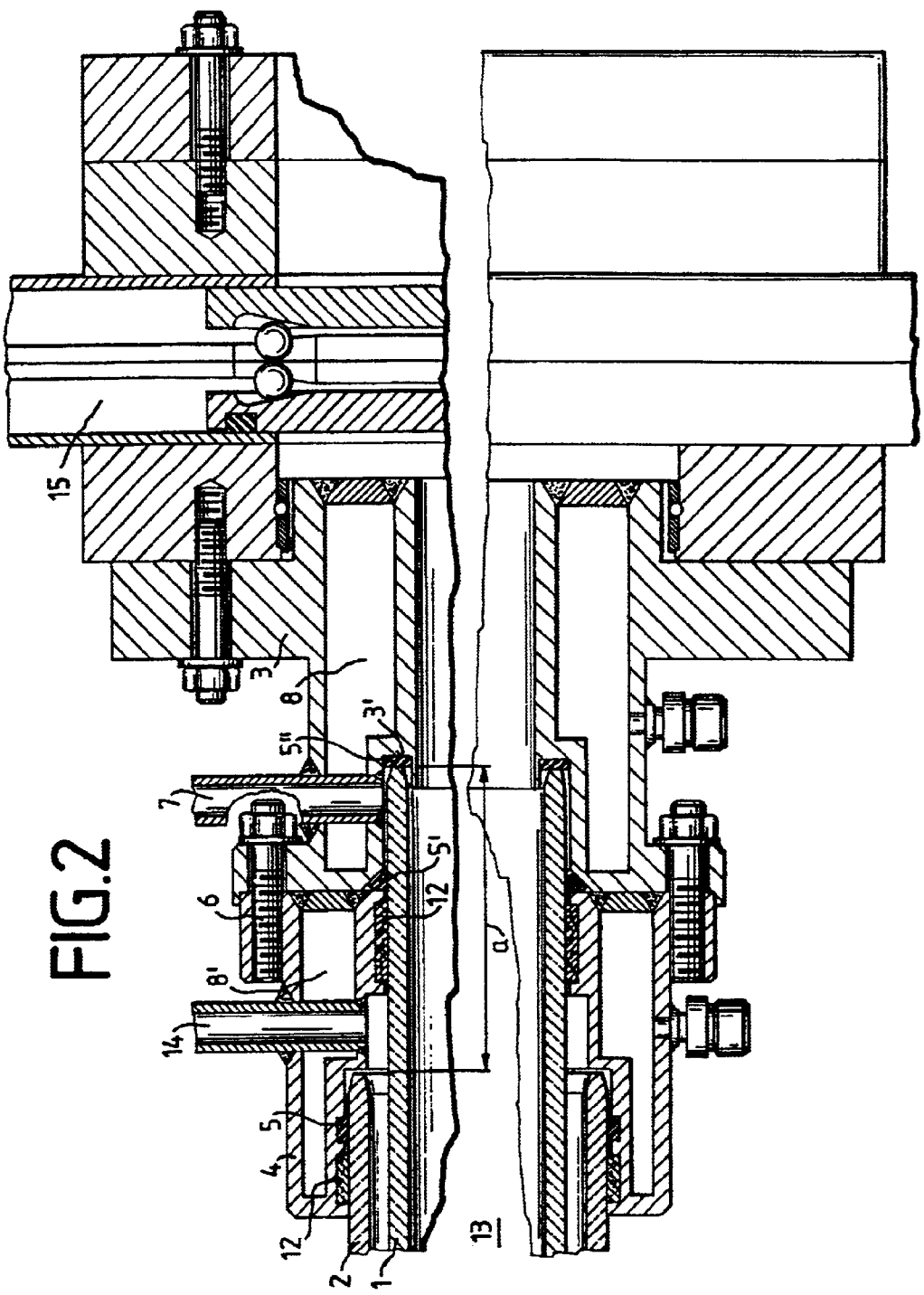

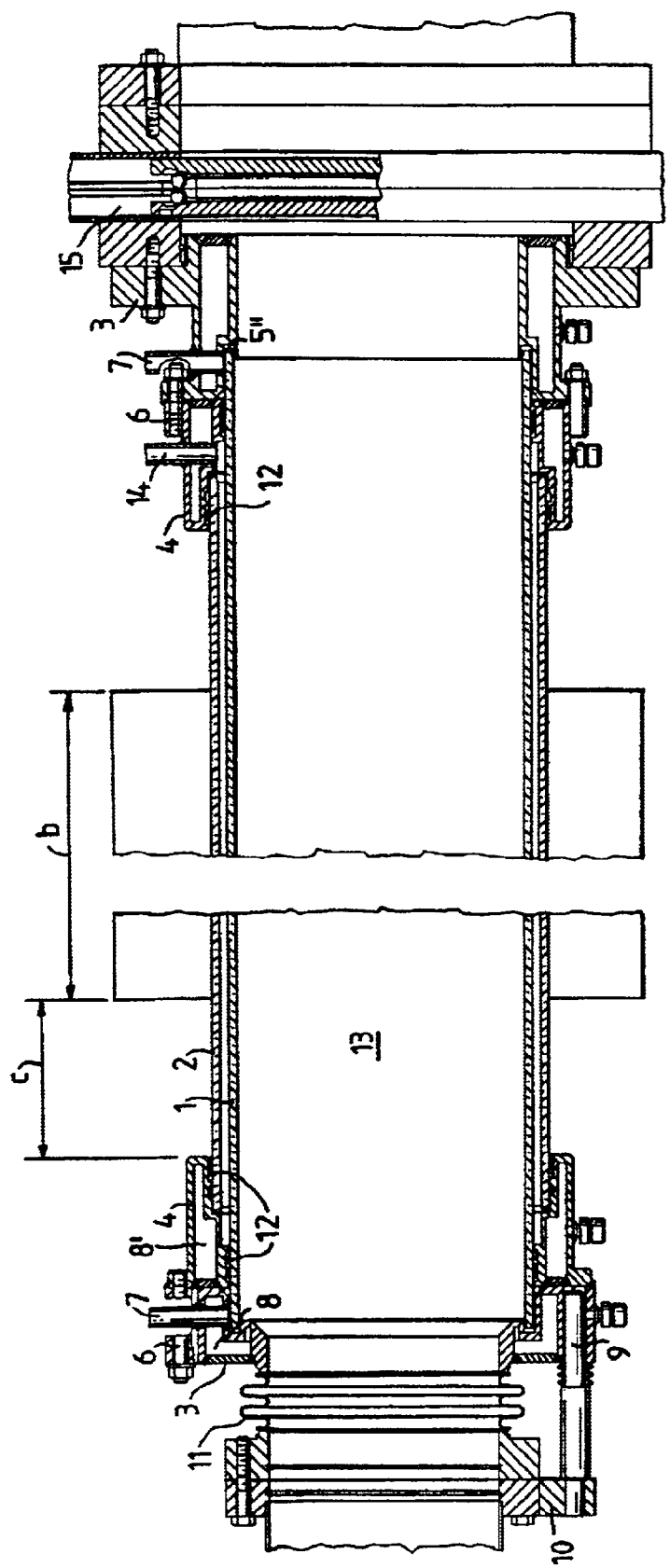

CHAMBER FOR CHEMICAL VAPOR DEPOSITION

CROSS-REFERENCE TO RELATED APPLICATION

This is a continuation of International Application No. PCT/CH00/00194, filed Apr. 4, 2000, which claims priority on German application 199 19 326.6, filed Apr. 28, 1999.

FIELD AND BACKGROUND OF THE INVENTION

The invention relates to a chamber for chemical vapor deposition. Chambers for chemical vapor deposition are known. By chemical vapor deposition (CVD=Chemical Vapor Deposition) is understood the coating of a heated surface with a solid from a chemical reaction in the vapor phase. The prospectus "SIRIUS A Low-Temperature Epitaxy UHV-CVD System" by LEYBOLD SYSTEMS GmbH, 1996, describes a chamber for chemical vapor deposition which is structured as a quartz tube. The chamber is connected with a pumping station at its one side. This pumping station serves for setting up the required vacuum in the chamber. The chamber is connected at its other side with the conveyance station with which the substrates to be coated are fed into the chamber. It has been found useful to develop the quartz tube as a double-shell tube. In the outer shell is therein disposed a short feed pipe with which it is possible to realize a vacuum between the outer and the inner tube of the double-shell tube. In this way the inner tube is advantageously protected against contaminations which, for reasons of the technical process, must not be deposited on the outside of the quartz tube. However, of disadvantage is therein that this connecting piece breaks away relatively quickly and stresses build up in the double-shell tube, which have a disadvantageous effect on the uniform heating of the center portion of the double-shell tube.

SUMMARY OF THE INVENTION

The invention therefore addresses the problem of providing a chamber for chemical vapor deposition, which has a relatively high breaking strength and in which the required connections can be fixed nearly free of stress.

The problem on which the invention is based is solved with a chamber for chemical vapor deposition which comprises an inner quartz tube encompassed by a shorter outer quartz tube, in which each end of the inner quartz tube is encompassed by a first flange, which has a groove encircling in the longitudinal direction of the inner quartz tube, in which in each instance the front side of the inner quartz tube is positioned, wherein between the first flange and the outside of the inner quartz tube a seal is disposed, and in which a second flange is disposed on the particular first flange in the direction toward the tube center, which has an encircling rim for fixing the front side of the shorter outer quartz tube, and which is in contact on the outside of the inner quartz tube as well as also on the outside of the shorter outer quartz tube, with a seal being disposed between the second flange and the outside of the shorter outer quartz tube, and minimally a second flange comprises minimally one closable connection line connected with the volume between the shorter outer quartz tube and the inner quartz tube, and in which each first flange and each second flange comprises at the inside in each instance a cooling channel with minimally one inlet and one outlet each for a cooling medium. The chamber is thus provided at both sides with a first flange, which, in addition to the fixing of the inner quartz tube serves also for the fastening of the chamber to adjacent structural parts. The seals are encircling seals. The connection between the first flange and the second flange disposed adjacent in the direction toward the tube center, takes place, for example with a screw connection. It has surprisingly been found that the breaking strength advantageously can be increased and stresses can largely be avoided if a direct connection between the shorter outer quartz tube and the inner quartz tube, which exists in the structuring of a double-shell tube, is omitted. Through the closable line connected with the volume between the shorter outer quartz tube and the inner quartz tube, the volume between the inner quartz tube and the shorter outer quartz tube can be relatively simply evacuated. The disposition of the closable line, which, as a rule, is developed in the form of a short piece of tube, takes place directly in the second flange, and it can be advantageous to dispose several closable lines. It is especially advantageous to dispose the closable lines perpendicularly to the longitudinal axis of the inner quartz tube. Each first flange and each second flange comprises in each instance a cooling chamber through which is conducted a cooling medium, for example a cooling fluid, such as water. The cooling medium serves for cooling the disposed seals.

A preferred embodiment of the invention comprises that minimally a first flange has minimally one closable line, which extends toward the inside of the inner quartz tube. Through this measure on the outside of the inner quartz tube directly at its end a vacuum can be set up, which is of advantage especially if in the interior of the chamber an ultra-high vacuum is established. In this case, evacuation takes place directly through the closable line, which advantageously can also be positioned perpendicularly to the longitudinal axis of the inner quartz tube.

According to a further preferred embodiment of the invention, the spacings a between the front side of the inner quartz tube and the front side, extending on the same side of the chamber, of the shorter outer quartz tube on both sides of the chamber in each instance are of identical size. This leads to the fact that the first flange and the second flange can be developed nearly identically on both sides of the chamber, since the dimensions at the tube ends are in each case identical. The flanges only need to be adapted constructionally to the directly adjacent installation portion, to the pumping station or to the conveyance device, which facilitates the fabrication. Through the simultaneously attained central disposition of the shorter outer quartz tube, moreover, the setting up of a homogeneous temperature distribution within the central heating zone is ensured.

A further preferred embodiment of the invention comprises that the spacing c between the particular second flange and the heating zone disposed centrally about the chamber is in the proximity of 60 mm to 130 mm. A spacing c of 60 mm to 130 mm has been found to be especially advantageous for most cases of application, since, if it is maintained, it is possible to realize in simple manner a constant temperature over the length of the heating zone.

According to a further preferred forming of the invention, the first flange at minimally one site comprises a bolt movably guided parallel to the longitudinal direction of the inner quartz tube with a compression spring in contact on the outside of the first flange, which is connected with an adjacent connection flange. The adjacent connection flange can be a portion of the pumping station or a portion of the conveyance device. The disposition of minimally one bolt with a compression spring in contact on the outside of the first flange increases the pressing force of the first flange onto the front side of the inner quartz tube, which increases the tightness against leakage.

According to a further preferred embodiment of the invention the first flange and the second flange, disposed in the direction toward the tube center, are fabricated as discrete parts, and the cooling channels form a single common cooling channel. It is therein advantageous that the connection between the first flange and the second flange can be omitted. The simplified construction is advantageous, especially if the chamber must be prepared especially rapidly for a chemical vapor deposition.

A further preferred embodiment of the invention comprises that in the encircling groove a further encircling seal is disposed. In this way the tightness of the chamber is especially advantageously increased and the seal disposed between the first flange and the outside of the inner quartz tube is relieved of loading.

BRIEF DESCRIPTION OF THE DRAWINGS

In the following the invention will be explained in further detail and by example in conjunction with the drawing (FIG. 1 to FIG. 3). Therein depict:

FIG. 2 a portion of the chamber for the chemical vapor deposition in cross section with the port connection line for the conveyance system, FIG. 3 the chamber for a chemical vapor deposition in cross section which at its one end is connected to a pumping station and with its other end to the conveyance device.

DESCRIPTION OF THE PREFERRED EMBODIMENT

Figure 1:
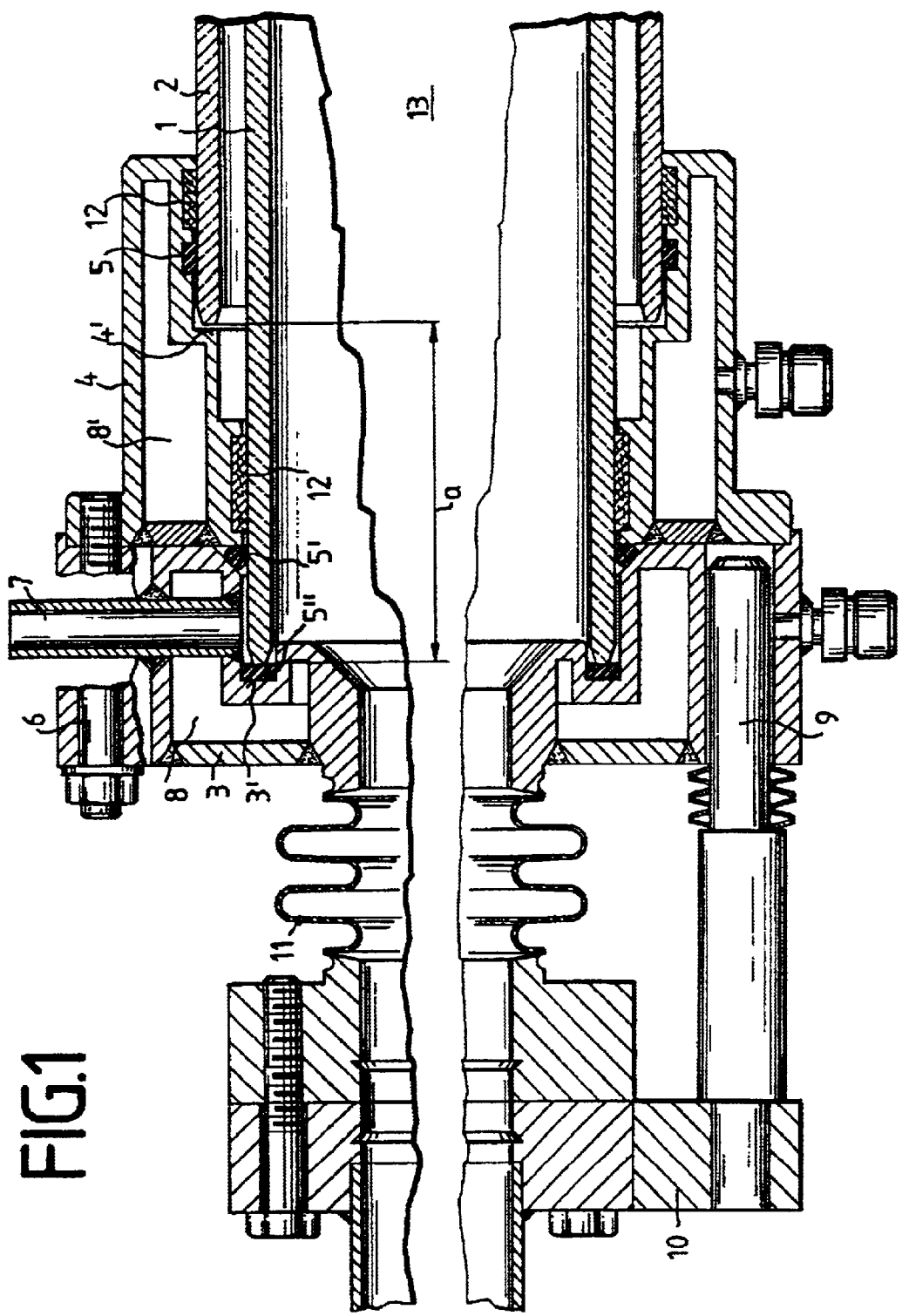
FIG. 1 a portion of the chamber for the chemical vapor deposition in cross section with the connection line to the pumping station.

In FIG. 1 is shown a portion of the chamber for a chemical vapor deposition in cross section, which is connected to a pumping station. The chamber comprises an inner quartz tube 1, which is encompassed by a shorter outer quartz tube 2. The end of the inner quartz tube 1 is encompassed by a first flange 3 which includes a groove 3' encircling the inner quartz tube 1 in the longitudinal direction, in which the front side of the inner quartz tube 1 is positioned. Between the first flange 3 and the outside of the inner quartz tube 1 a seal 5' is disposed. At the particular first flange 3 in the direction toward the tube center a second flange 4 is disposed, which has an encircling rim 4' for fixing of the front side of the shorter outer quartz tube 2 and which is in contact on the outside of the inner quartz tube 1 as well as also on the outside the shorter outer quartz tube 2. Between the second flange 4 and the outside of the shorter outer quartz tube 2 a seal 5 is also disposed. The first flange 3 and the second flange 4 comprise each on the inside a cooling channel 8, 8' with minimally one inlet and one outlet for a cooling medium (not shown). The first flange 3 comprises a closable connection line 7, which extends toward the inside of the inner quartz tube 1. The closable line 7 makes possible the setting up of a vacuum on the outside of the inner quartz tube 1 at its end, which is of particular advantage when in the interior 13 of the chamber an ultra-high vacuum has been set up. Between the second flange 4 and the outsides of the shorter outer quartz tube 2 and of the inner quartz tube 1 a layer 12 comprising polytetrafluoroethylene is disposed at two sites. These layers 12, which are fixed as encircling bands in grooves, which are disposed in the second flange 4, act as supports for the inner quartz tube 1 and for the shorter outer quartz tube 2 and serve thus for stabilizing the chamber. Between the front sides of the inner quartz tube 1 and of the shorter outer quartz tube 2 exists a spacing a, which should preferably be of equal size on both sides of the chamber. This facilitates the constructional fabrication, since at both sides of the chamber flanges can be employed, which are nearly structurally identical. Parallel to the longitudinal direction of the inner quartz tube 1 in the first flange 3 a bolt 9 is movably guided with a compressing spring in contact on the outside of the first flange 3, which is connected with the adjacent connection flange 10 of the pumping station. The bolt 9 with a compression spring in contact on the outside of the first flange augments the pressing force onto the front side of the inner quartz tube 1, which is of particular advantage if in the encircling groove 3' a further encircling seal 5" is disposed. The first flange 3 is therein connected via a bellows 11 with the connection flange 10. The bellows 11 compensates thermal length expansions such as the spring on the movably guided bolt 9. The first flange 3 and the second flange 4 are connected via a screw connection 6.

In FIG. 2 is depicted the chamber for a chemical vapor deposition in cross section, whose end is connected with a conveyance device. The second flange 4 comprises a closable connection line 14, which is connected with the volume between the shorter outer quartz tube 2 and the inner quartz tube 1. With the closable line 14 the volume between the inner quartz tube 1 and the shorter outer quartz tube 2 can be evacuated in relatively simple manner. The first flange 3 is connected directly with the slide valve 15, which is a part of the conveyance device and through which the conveyance feeding of the chamber with the substrates takes place. As a rule it is advantageous, to fabricate the first flange 3 and the second flange 4 as discrete parts such that, for example, the screw connection 6 can be omitted. It is useful to develop the cooling channels 8, 8' as integral single common cooling channel (not shown).

In FIG. 3 the chamber for a chemical vapor deposition is shown in cross section, wherein the one end is connected via a connection flange 10 with a pumping station, and the other end borders on a conveyance device with a slide valve 15. About the spacing b is centrally disposed a heating zone (not shown). The spacing c between the second flange 4 and the heating cone centrally disposed about the chamber is advantageously between 60 mm and 130 mm. This spacing is satisfactory for most application purposes.

What is claimed is:

1. Chamber for a chemical vapor deposition comprising an inner quartz tube (1) encompassed by a shorter outer quartz tube (2), in which each end of the inner quartz tube (1) is encompassed by a first flange (3), which comprises a groove (3') encircling in the longitudinal direction of the inner quartz tube (1), in which in each instance the front side of the inner quartz tube (1) is positioned, wherein between the first flange (3) and the outside of the inner quartz tube (1) a seal (5') is disposed, and in which on the particular first flange (3) in the direction toward the tube center of a second flange (4) is disposed which comprises an encircling rim (4') for fixing the front side of the shorter outer quartz tube (2) and which is in contact on the outside of the inner quartz tube (1) as well as also on the outside of the shorter outer quartz tube (2), wherein between the second flange (4) and the outside of the shorter outer quartz tube (2) a seal (5) is disposed, and minimally a second flange (4) comprises minimally one closable connection line (14), which is connected with the volume between the shorter outer quartz tube (2) and the inner quartz tube (1), and in which each first flange (3) and each second flange (4) on the inside comprises in each instance one cooling channel (8, 8') with in each instance minimally one inlet and one outlet for a cooling medium.

2. Chamber as claimed in claim 1, in which minimally one first flange (3) has minimally one closable line (7) which extends toward the inside of the inner quartz tube (1).

3. Chamber as claimed in claim 1, in which between the second flange (4) and the outer of the shorter outer quartz tube (2) at minimally one site a layer (12) of polytetrafluoroethylene is disposed.

4. Chamber as claimed in claim 1, in which the spacing (a) between the front side of the inner quartz tube (1) and the front side, extending on the same side of the chamber, of the shorter outer quartz tube (2) at both sides of the chamber are of equal size.

5. Chamber as claimed in claim 1, in which the spacing (c) between the particular second flange (4) and the heating zone disposed centrally about the chamber is in the range of 60 mm to 130 mm.

6. Chamber as claimed in claim 1, in which the first flange (3) comprises at minimally one site a bolt (9), movably guided parallel to the longitudinal direction of the inner quartz tube (1) with a compression spring in contact on the outside of the first flange (3), which is connected with an adjacent connection flange (10).

7. Chamber as claimed in claim 1, in which the first flange (3) and the second flange (4) disposed in the direction toward the tube center are fabricated as discrete parts and the cooling channels (8, 8') form a single common cooling channel.

8. Chamber as claimed in claim 1, in which in the encircling groove (3') a further encircling seal (5") is disposed.

* * * * *